(12) United States Patent
Cho et al.

(10) Patent No.: US 9,257,461 B2
(45) Date of Patent: Feb. 9, 2016

(54) IMAGE DEVICE INCLUDING DYNAMIC VISION SENSOR, AMBIENT LIGHT SENSOR AND PROXIMITY SENSOR FUNCTION

(71) Applicant: Samsung Electronics Co., Ltd., Suwon-Si, Gyeonggi-Do (KR)

(72) Inventors: Soonik Cho, Seoul (KR); Moo-Young Kim, Suwon-si (KR); Minseok Oh, Osan-si (KR); Taechan Kim, Yongin-si (KR); Jae-Cheol Yun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 14/336,428

(22) Filed: Jul. 21, 2014

(65) Prior Publication Data

US 2015/0069218 A1    Mar. 12, 2015

(30) Foreign Application Priority Data

Sep. 10, 2013 (KR) .................. 10-2013-0108229

(51) Int. Cl.
　　*H01L 27/00*　　(2006.01)
　　*H01L 27/146*　　(2006.01)
　　*G01S 17/00*　　(2006.01)
　　*H04N 5/378*　　(2011.01)

(52) U.S. Cl.
　　CPC ........... *H01L 27/14601* (2013.01); *G01S 17/00* (2013.01); *H04N 5/378* (2013.01)

(58) Field of Classification Search
　　CPC ............ H01L 27/146; H01L 27/14603; H01L 27/14609
　　USPC ..... 250/208.1, 214 AL, 214 B, 214 R, 338.4; 356/4.01, 4.07
　　See application file for complete search history.

(56) References Cited

U.S. PATENT DOCUMENTS

| | | | |
|---|---|---|---|
| 5,834,765 A * | 11/1998 | Ashdown | G01J 1/04 250/214 AL |
| 7,728,269 B2 | 6/2010 | Lichtsteiner et al. | |
| 8,097,851 B2 | 1/2012 | Chang et al. | |
| 8,213,999 B2 | 7/2012 | Luke et al. | |
| 8,258,453 B2 | 9/2012 | Rees | |
| 8,269,172 B2 | 9/2012 | Skurnik | |
| 8,531,528 B2 | 9/2013 | Lee | |
| 2010/0314543 A1 | 12/2010 | Lee et al. | |
| 2011/0193968 A1 | 8/2011 | Lee | |
| 2013/0048837 A1 | 2/2013 | Pope et al. | |

FOREIGN PATENT DOCUMENTS

KR　20090028159 A　3/2009
KR　20110034264 A　4/2011

OTHER PUBLICATIONS

Patrick Lichtsteiner, A 128×128 120dB 15 µs. Latency Asynchronous Temporal Contrast Vision Sensor, IEEE Journal of Solid-State Circuits, Feb. 2008, 11 pages, vol. 43, No. 2.

* cited by examiner

*Primary Examiner* — Kevin Pyo
(74) *Attorney, Agent, or Firm* — Harness, Dickey & Pierce, P.L.C.

(57) ABSTRACT

An image device including a pixel array and a controller, The pixel array having first pixels and second pixels and corresponding channel drivers. The controller may perform operations of a dynamic vision sensor (DVS), an ambient light sensor (ALS) and a proximity sensor (PS).

20 Claims, 12 Drawing Sheets

IMAGE DEVICE INCLUDING DYNAMIC VISION SENSOR, AMBIENT LIGHT SENSOR AND PROXIMITY SENSOR FUNCTION

CROSS-REFERENCE TO RELATED APPLICATIONS

A claim for priority under 35 U.S.C. §119 is made to Korean Patent Application No. 10-2013-0108229 filed on Sep. 10, 2013, in the Korean Intellectual Property Office, the entire contents of which are hereby incorporated by reference.

BACKGROUND

Example embodiments of the inventive concepts herein relate to an image device, and more particularly, to an image device including a dynamic vision sensor, an ambient light sensor and a proximity sensor.

An image device may include an image sensor that responds to light entering the image device and output data in response thereto. The image sensor may be divided into an image pickup tube (e.g., a vidicon, a plumbicon, etc.) and a solid-state image sensor (e.g., a complementary metal oxide semiconductor (CMOS), a charge coupled device (CCD), etc.)

Recently, image sensors of a solar cell method are being used to realize a wide dynamic range (WDR). A dynamic vision sensor (DVS) is provided as the image sensor of a solar cell method. As the amount of functions integrated into a mobile device expands, constituent elements included in the mobile device may need to be miniaturized.

SUMMARY

Example embodiments of inventive concepts provide an image device. The image device includes a pixel array; and a controller configured to perform operations of a dynamic vision sensor, an ambient light sensor and a proximity sensor on the basis signals being output from the pixel array. The pixel array comprises first pixels configured to generate first photocurrents on the basis of intensity of light received from the outside and output first output signals on the basis of the generated first photocurrents; second pixels configured to generate second photocurrents on the basis of intensity of infrared light among light received from the outside and output second output signals on the basis of the generated second photocurrents; a first channel driver configured to be connected to the first pixels and provide the sum of the first photocurrents generated in the first pixels to a first channel; and a second channel driver configured to be connected to the second pixels and provide the sum of the second photocurrents generated in the second pixels to a second channel. The controller comprises a dynamic vision sensor driving unit configured to output contrast data and addresses corresponding to the first and second pixels respectively on the basis of the first and second output signal; an ambient light sensor driving unit configured to output illumination intensity data on the basis of the sum of the first photocurrents received through the first channel and the sum of the second photocurrents received through the second channel; and a proximity sensor driving unit configured to output a proximity signal on the basis of the amount of change of the sum of the second photocurrents received through the second channel.

In one or more example embodiments, each of the first and second channel drivers is embodied by a transistor.

In one or more example embodiments, each of the first pixels comprises a first light receiving unit configured to generate the first photocurrent in response to the received light; a first comparing unit configured to generate a first control signal on the basis of the generated first photocurrent; and a first quantizing unit configured to output the first output signal according to the first control signal. The each of the second pixels comprises an infrared pass filter configured to pass infrared light among the received light; a second light receiving unit configured to generate the second photocurrent in response to the filtered light; a second comparing unit configured to generate a second control signal on the basis of the generated second photocurrent; and a second quantizing unit configured to output the second output signal according to the second control signal. The first and second comparing units reset the control signals according to a reset signal received from the dynamic vision sensor driving unit.

In one or more example embodiments, in the case that the first photocurrent increase, a level of the first control signal increases, in the case that the first photocurrent is reduced, a level of the first control signal is reduced, in the case that the second photocurrent increase, a level of the second control signal increases, and in the case that the second photocurrent is reduced, a level of the second control signal is reduced.

In one or more example embodiments, each of the first and second output signals comprises an ON signal and an OFF signal, in the case that the first control signal reaches a first critical value, the ON signal of the first output signal becomes high level and in the case that the first control signal reaches a second critical value, the OFF signal of the first output signal becomes high level, and in the case that the second control signal reaches a third critical value, the ON signal of the second output signal becomes high level and in the case that the second control signal reaches a fourth critical value, the OFF signal of the second output signal becomes high level.

In one or more example embodiments, the fourth critical value is greater than the second critical value, the third critical value is greater than the fourth critical value and the first critical value is greater than the third critical value.

In one or more example embodiments, in the case that the ON or OFF signal has a high level, the dynamic vision sensor driving unit transmits the reset signal to a pixel outputting the ON or OFF signal of a high level.

In one or more example embodiments, the first light receiving unit is connected to the first channel driver and the second light receiving unit is connected to the second channel driver.

In one or more example embodiments, the dynamic vision sensor driving unit comprises first and second arbiters configured to detect the first output signals of the first pixels; an address encoder configured to detect an address of the first pixels; and a buffer configured to temporarily store the detected first output signals. The dynamic vision sensor driving unit is configured to output the detected first output signals and the detected address to an external device.

In one or more example embodiments, the ambient light sensor driving unit comprises a first analog-digital converter configured to convert the sum of the first photocurrents received through the first channel into a first digital signal; a second analog-digital converter configured to convert the sum of the second photocurrents received through the second channel into a second digital signal; and a signal processing unit configured to process the first and second digital signals to output the illumination intensity data.

In one or more example embodiments, the first analog-digital converter comprises a current mirror configured to receive the sum of the first photocurrents through the first channel to output a first current equal to the received sum of the first photocurrents; a capacitor configured to be charged based on the first current; a switch parallel-connected with the capacitor; a comparator configured to compare a charging voltage of the capacitor with a reference voltage to output a comparison result; a counter configured to count an output of the comparator to output the first digital signal; and a timing controller configured to control the switch so that the charging voltage is discharged on the basis of the output of the comparator.

In one or more example embodiments, the second analog-digital converter comprises a current mirror configured to receive the sum of the second photocurrents through the second channel to output a second current equal to the received sum of the second photocurrents; a capacitor configured to be charged based on the second current; a switch parallel-connected with the capacitor; a comparator configured to compare a charging voltage of the capacitor with a reference voltage to output a comparison result; a counter configured to count an output of the comparator to output the second digital signal; and a timing controller configured to control the switch so that the charging voltage is discharged on the basis of the output of the comparator.

In one or more example embodiments, the ambient light sensor comprises an analog-digital converter converting the sum of the first and second photocurrents received through the first and second channels into first and second digital signals respectively; and a signal processing unit processing the first and second digital signals to output the illumination intensity data.

In one or more example embodiments, the proximity sensor driving unit comprises an infrared light emitting diode, and generates the proximity signal on the basis of the amount of change of the sum of the second photocurrents received through the second channel to output it.

In one or more example embodiments, in the case that the sum of the second photocurrents increases, a level of the proximity signal increases.

One or more example embodiments relates to an image device.

In one or more example embodiments, the image device includes a pixel array including first pixels and second pixels therein, the first pixels configured to generate a first photocurrent and a first activity signal based on an intensity of at least visible light received incident thereto and the second pixels configured to generate a second photocurrent and a second activity signal based on an intensity of infrared light received incident thereto; and a controller including, a dynamic vision sensor driving unit configured to generate motion data indicating a motion of an external object based on the first photocurrent from the first pixels whose first activity signal is enabled; an ambient light sensor driving unit configured to generate illumination data indicating an intensity of the visible light; and a proximity sensor driving unit configured to generate proximity data based on a change in the second photocurrent, the proximity data indicating a proximity of an object to the image device.

In one or more example embodiments, each of the first pixels include a transistor configured output a sum of the first photocurrents and each of the second pixels include a second transistor configured to output a sum of the second photocurrents, and the ambient light sensor driving unit is configured to generate the illumination data based on the sum of the first photocurrents and the sum of the second photocurrents.

In one or more example embodiments, each of the first pixels include a photo detector configured to generate the first photocurrent based on the intensity of at least the visible light received incident thereto; a comparator configured to generate a comparing signal based on a variation in the first photocurrent; and a quantizer configured to generate the first activity signal if the variation in the first photocurrent exceeds a threshold.

In one or more example embodiments, the dynamic vision sensor driving unit is configured to determine locations of the first pixels and second pixels within the pixel array that are enabled based on the first activity signal and the second activity signal, respectively.

In one or more example embodiments, each of the first pixels and second pixels are configured to asynchronously output the first photocurrent and the second photocurrent, respectively, and the dynamic vision sensor driving unit is configured to determine the motion of the external object without utilizing data from the first pixels of the image device that do not detect a change in the intensity of the visible light.

BRIEF DESCRIPTION OF THE FIGURES

The above and other objects and features will become apparent from the following description taken in conjunction with the accompanying drawings of which like reference numerals refer to like parts throughout the various figures unless otherwise specified, and.

DETAILED DESCRIPTION

Figure 1:
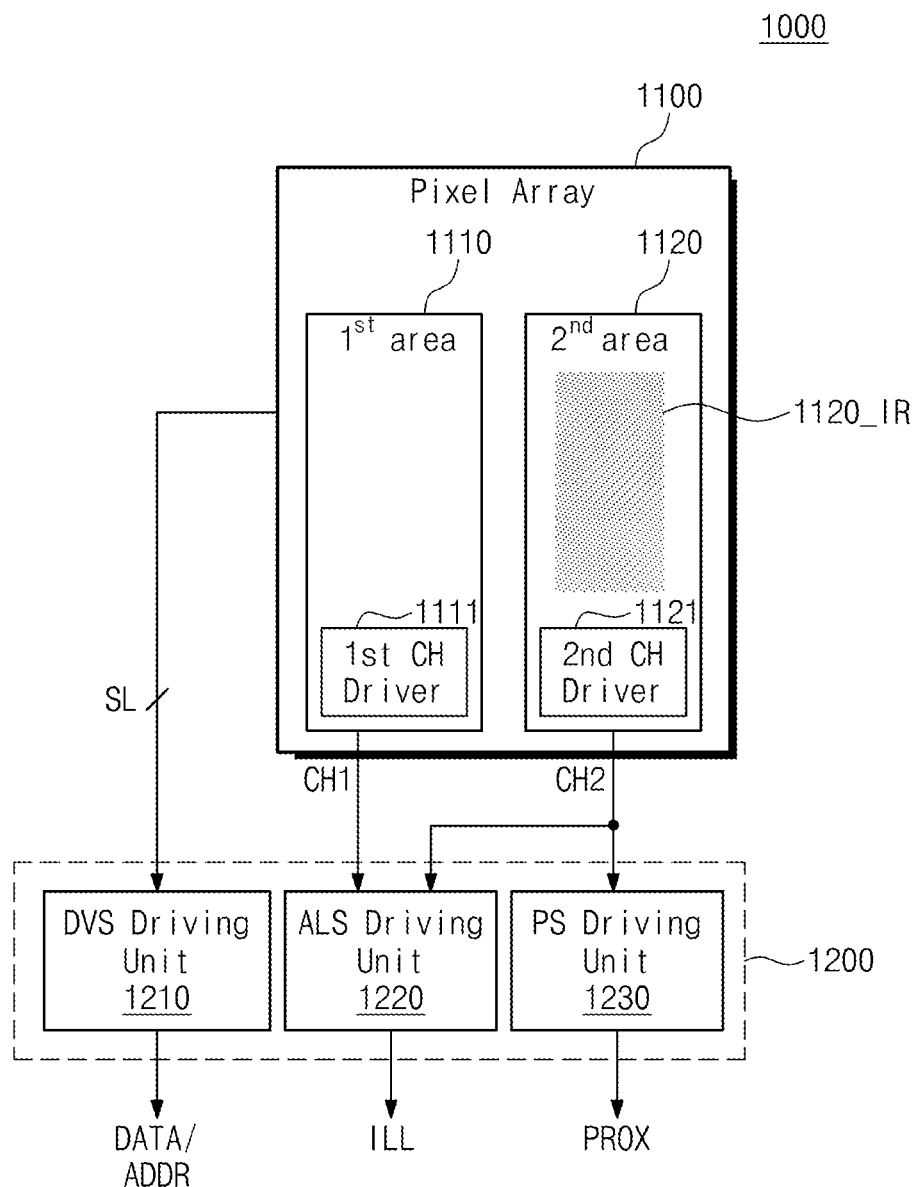
FIG. 1 is a block diagram illustrating an image device in accordance with an example embodiment of the inventive concepts.

Some example embodiments will be described in detail with reference to the accompanying drawings. The inventive concepts, however, may be embodied in various different forms, and should not be construed as being limited only to the described example embodiments. Rather, these example embodiments are provided as examples so that this disclosure will be thorough and complete, and will fully convey the inventive concepts to those skilled in the art. Accordingly, known processes, elements, and techniques are not described with respect to some of the example embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

An image device in accordance with one or more example embodiments of the inventive concepts may perform operations of a dynamic vision sensor (DVS), an ambient light sensor (ALS) and a proximity sensor (PS) together. Therefore, the imaging device may have a reduced cost and area.

FIG. 1 is a block diagram illustrating an image device in accordance with an embodiment of the inventive concept.

Referring to FIG. 1, an image device 1000 includes a pixel array 1100 and a controller 1200.

The pixel array 1100 may include first and second areas 1110 and 1120. Each of the first and second areas 1110 and 1120 may include a plurality of pixels. Each pixel may respond to intensity of light entering the pixel from the outside to generate a photocurrent. The second area 1120 may include an infrared pass filter 1120_IR. The infrared pass filter 1120_IR may be configured to pass only infrared light among light entering the infrared pass filter 1120_IR from the outside. The pixels included in the second area 1120 may generate a photocurrent according to intensity of infrared light filtered by the infrared pass filter 1120_IR.

Each pixel can output output signals (ON, OFF) on the basis of a change of the amount of photocurrent. For example, in the case that the intensity of light being injected into a pixel becomes strong, a photocurrent being output from the pixel increases. In the case that the intensity of light being injected into a pixel becomes weak, a photocurrent being output from the pixel is reduced. At this time, as a photocurrent is reduced, the pixel outputs a second signal OFF. That is, each pixel may output a signal corresponding to contrast of light entering the pixel from the outside.

In one or more example embodiments, the first and second areas 1110 and 1120 include first and second channel drivers 1111 and 1121 respectively. Each pixel of the first area 1110 is connected to the first channel driver 1111 and a photocurrent generated from the pixels of the first area 1110 can be output through a first channel CH1. Each pixel of the second area 1120 is connected to the second channel driver 1121 and a photocurrent generated from the pixels of the second area 1120 can be output through a second channel CH2.

A controller 1200 includes a dynamic vision sensor (DVS) driving unit 1210, an ambient light sensor (ALS) driving unit 1220 and a proximity sensor (PS) driving unit 1230. The DVS driving unit 1210 is connected to the pixels of the first and second areas 1110 and 1120 through a plurality of signal lines SL. The DVS driving unit 1210 can receive the first and second signals (ON, OFF) from the pixels of the first and second areas 1110 and 1120 to transmit a reset signal RESET to the pixels in response to the received first and second signals (ON, OFF). The DVS driving unit 1210 can transmit addresses of the pixels and signals output from the pixels to an external device. The DVS driving unit 1210 will be described in further detail with reference to FIG. 6.

Since each pixel independently (e.g., asynchronously) operates unlike data of a frame unit image, contrast data DATA and an address ADDR being output from the DVS driving unit 1210 can be applied as a means sensing a motion of an external object.

The ALS sensing unit 1220 is connected to the pixels included in the first and second areas 1110 and 1120 through the first and second channels CH1 and CH2. The ALS driving unit 1220 can convert an intensity of the illumination of light that entered from the outside through the first and second channels CH1 and CH2 on the basis of the sum of photocurrents of the pixels. The ALS driving 1220 can output the converted illumination intensity as illumination intensity data ILL. A constitution and operation of the ALS driving unit 1220 will be described in further detail with reference to drawings below.

The PS driving unit 1230 can judge whether an object located outside the image device 1000 approaches the image device 1000 basis on the amount change in the photocurrent generated by the pixels in the second area 1120. The PS driving unit 1230 can emit infrared light to the outside through an IR LED (not shown). In the case that an object approaches the image device 1000, the emitted infrared light is reflected by the approaching object to enter the pixel array 1100. In this case, since the second area 1120 includes an infrared filter, a photocurrent of the pixels included in the second area 1120 increases. Therefore, the PS driving unit 1230 can judge whether an external object approaches the image device 1000 and output a proximity signal based on a result thereof.

The DVS driving unit 1210, ALS Driving Unit 1220, the PS Driving Unit and/or the sub units thereof discussed herein, may include an application processor (AP), a microprocessor, a central processing unit (CPU), an application-specific integrated circuit (ASIC), a mobile system on Chip (SoC), a multimedia SoC, a device similar thereto, or a system similar thereto configured to perform the functions associated with the respective unit.

According to one or more example embodiments of the inventive concepts described above, the image device 1000 can perform operations of the DVS, ALS and PS together. Thus, the image device may have a reduced cost and area.

Figure 2:
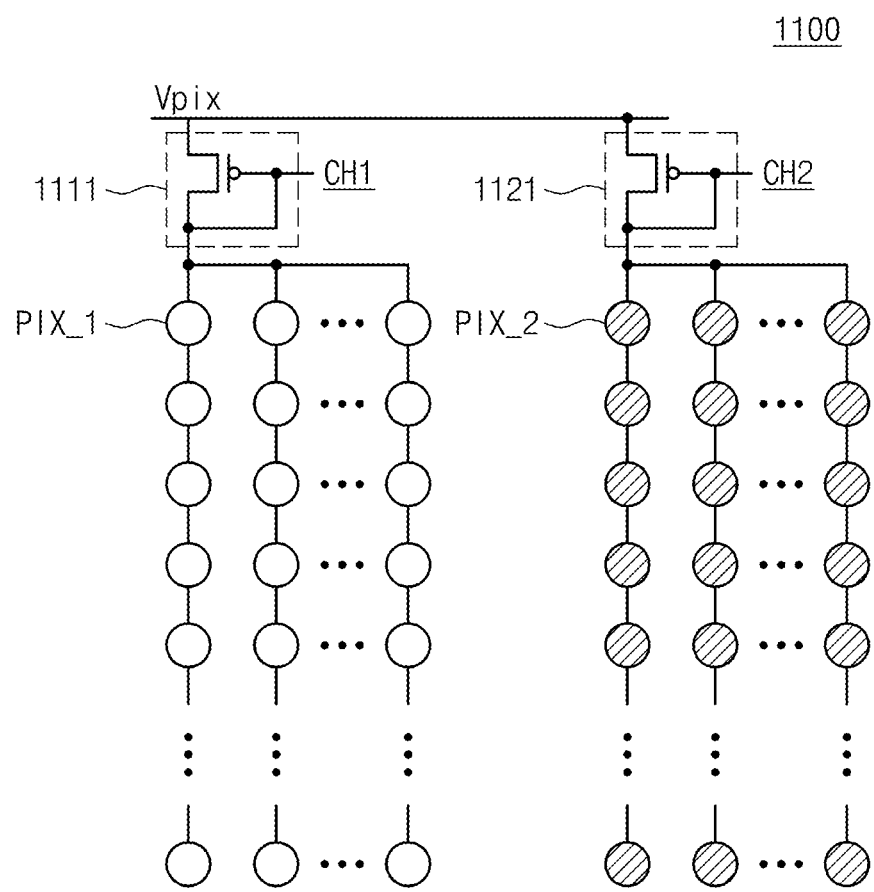
FIG. 2 is a drawing illustrating a pixel array illustrated in FIG. 1 in detail.
Figure 3:
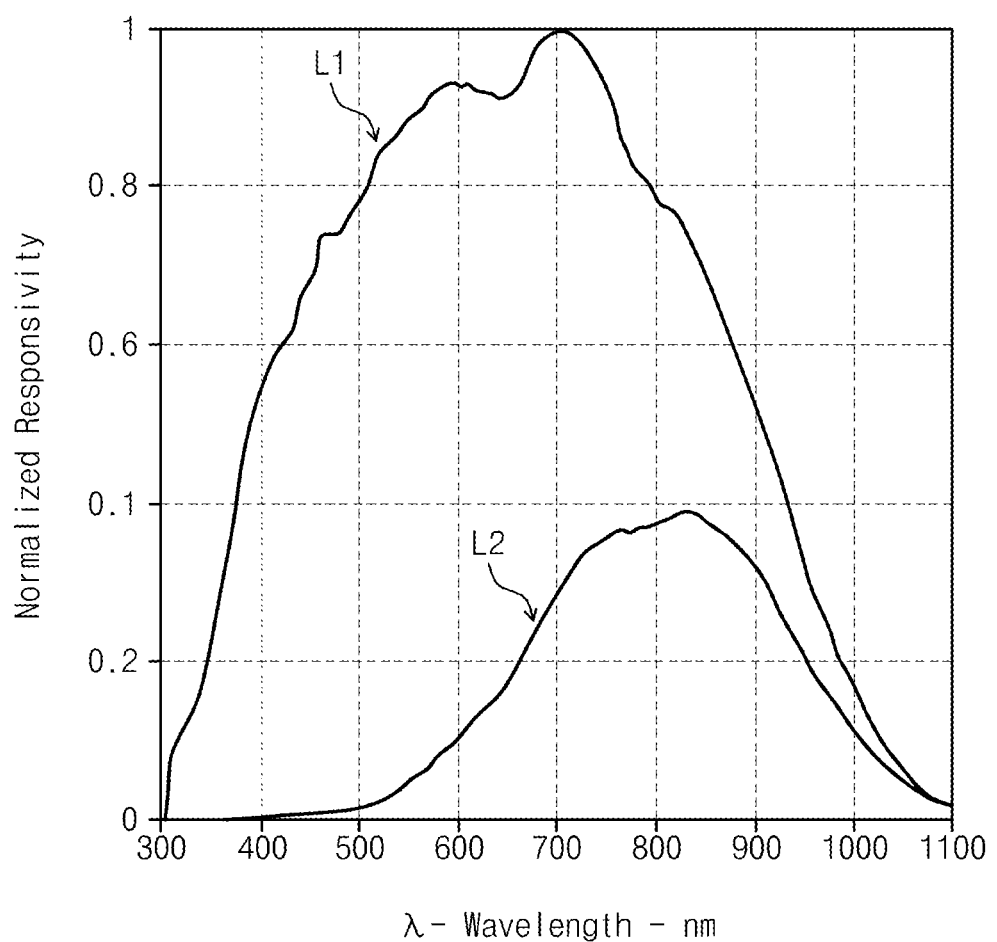
FIG. 3 is a graph showing intensity of light entering first and second areas.

FIG. 2 is a drawing illustrating a pixel array illustrated in FIG. 1 in detail. FIG. 3 is a graph showing intensity of light entering first and second areas.

Referring to FIGS. 2 and 3, the pixel array 1100 includes first and second areas 1110 and 1120. The first and second areas 1110 and 1120 include first and second pixels PIX_1 and PIX_2 respectively. The first pixels PIX_1 are connected to a first channel driver 1111. The first channel driver 1111 can provide the sum of photocurrents generated from the first pixels PIX_1 to a first channel CH1. The second pixels PIX_2 are connected to a second channel driver 1121. The second channel driver 1121 can provide the sum of photocurrents generated from the second pixels PIX_2 to a second channel CH2. When light enters the pixel array 1100 from the outside, the first channel driver 1111 can transmit the sum of photocurrents of the first pixels PIX_1 to an external device (e.g., the ALS driving unit 1220 of FIG. 1) through the first channel CH1 and the second channel driver 1121 can transmit the sum of photocurrents of the second pixels PIX_2 to an external device through the second channel CH2. In one or more example embodiments, a transistor may be provided as the first and second channel drivers 1111 and 1121.

The second pixels PIX_2 may further include an infrared pass filter 1120_IR. Even if same light enters the first and second pixels PIX_1 and PIX_2, since the second pixels PIX_2 generates only a photocurrent of an infrared light component, photocurrents being output through the first and second channels CH1 and CH2 may be different from each other. As illustrated in FIG. 3, light in all wavelength regions enters the first pixels PIX_1 as indicated by line L1 and only light in an infrared wavelength region enters the second pixels PIX_2 as indicated by line L2. Thus, photocurrents being output through the first and second channels CH1 and CH2 may be different from each other.

Each of the first pixels PIX_1 is connected to the DVS driving unit 1210 and the DVS driving unit 1210 outputs data and addresses corresponding to the respective first pixels PIX_1 and can transmit the data and addresses to an external device.

Figure 4:
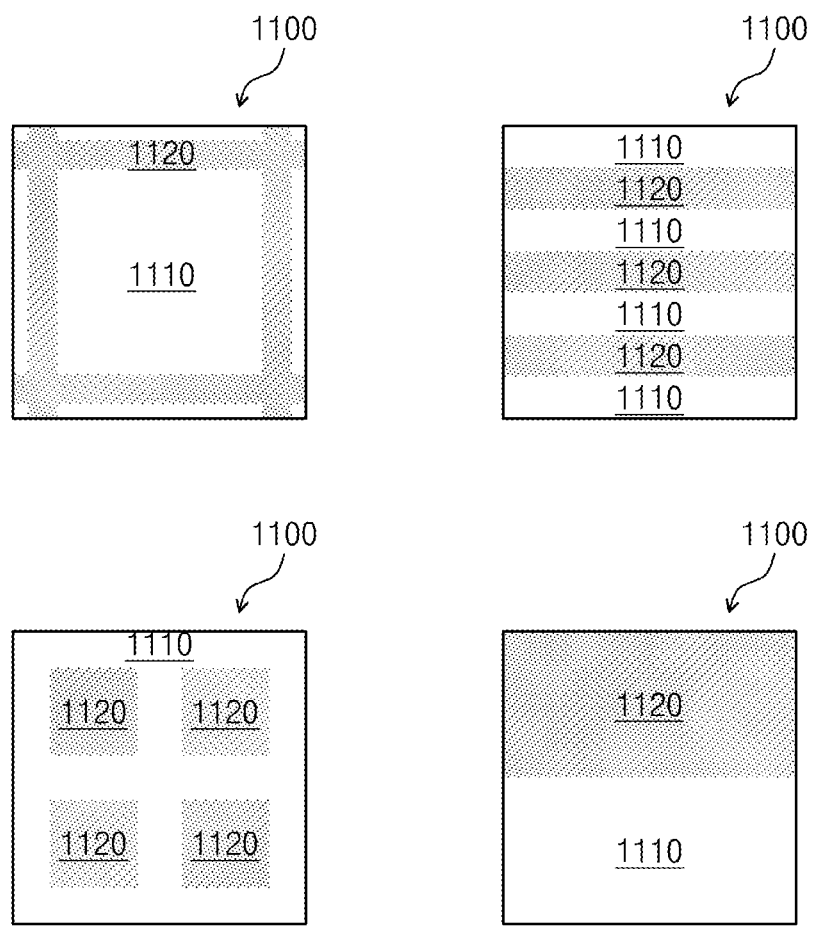
FIG. 4 illustrates drawings showing examples of a constitution of a pixel array illustrated in FIG. 1.

FIG. 4 illustrates drawings showing examples of a constitution of a pixel array illustrated in FIG. 1.

Referring to FIG. 4, a pixel array 1100 includes first and second areas 1110 and 1120. The second pixels PIX_2 may further include an infrared pass filter 1120_IR. As illustrated in FIG. 4, the first and second areas 1110 and 1120 can be arranged in various ways. However, example embodiments of the inventive concepts are not limited to the illustrated examples and the pixel array 1100 be embodied differently than the pixel arrays 1100 illustrated in FIG. 4.

Figure 5:
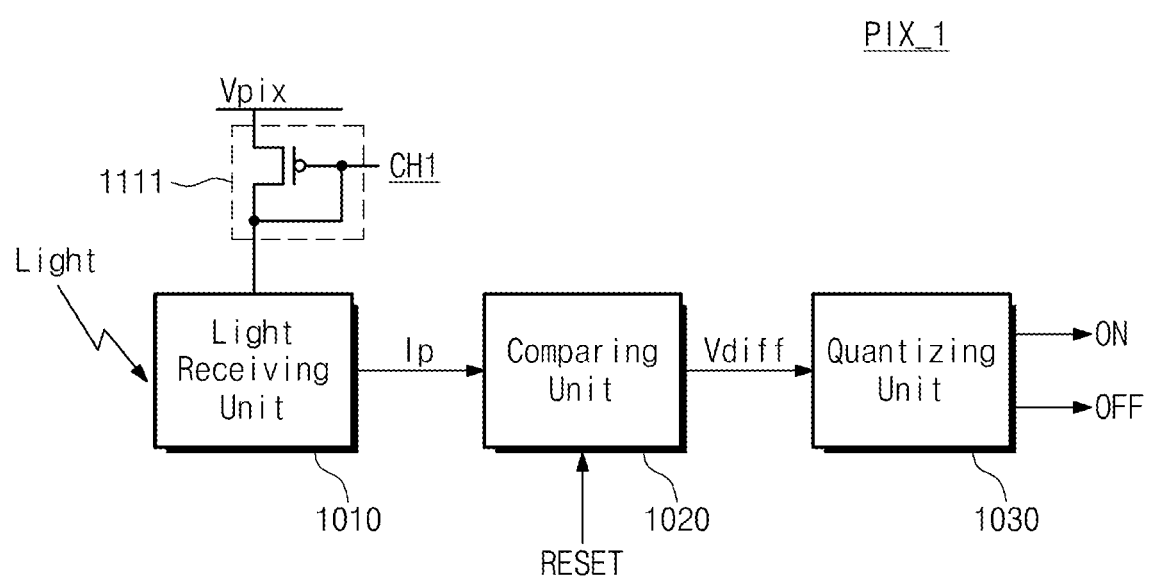
FIG. 5 is a drawing illustrating a first pixel illustrated in FIG. 2.

FIG. 5 is a drawing illustrating a first pixel illustrated in FIG. 2.

Referring to FIG. 5, the first pixel PIX_1 includes a light receiving unit 1010, a comparing unit 1020 and a quantizing unit 1030. The light receiving unit 1010 generates a photocurrent Ip in response to light received from the outside. The light receiving unit 1010 may include a photo diode. The photo diode can generate a photocurrent Ip in response to light received from the outside. The generated photocurrent Ip is transmitted to the comparing unit 1020.

The comparing unit 1020 can output a control signal Vdiff on the basis of an amount that the received photocurrent Ip changes. For example, in the case that the received photocurrent Ip increases, the control signal Vdiff may increase. In the case that the received photocurrent Ip is reduced, the control signal Vdiff may be reduced. In the case that the received photocurrent Ip does not change, the control signal Vdiff can maintain a constant value. The comparing unit 1020 may receive a reset signal RESET from the DVS driving unit 1210 and can reset the control signal Vdiff in response to the reset signal RESET.

The quantizing unit 1030 can output the first and second signals (ON, OFF) on the basis of the received control signal Vdiff. For example, in the case that the received control signal Vdiff reaches a first critical value, the quantizing unit 1030 can output the first signal ON at a high level. In the case that the received control signal Vdiff reaches a second critical value, the quantizing unit 1030 can output the second signal OFF at a high level. The first critical value may be greater than the second critical value. The first and second signals (ON, OFF) are transmitted to the DVS driving unit 1210.

A quantizing unit included in the second pixel PIX_2 may have a small range of critical value as compared with the quantizing unit 1030 of the first pixel PIX_1. Since the second pixel PIX_2 operates based on light filtered by the infrared pass filter 1120_IR, the second pixel PIX_2 may generate a smaller quantity of photocurrents than the first pixel PIX_1. That is, in the case that the quantizing unit of the second pixel PIX_2 operates based on third and fourth critical values, contrast data can be generated based on an output signal of the second pixel PIX_2 by making a difference between the third and fourth critical values smaller than a difference between the first and second critical values.

The light receiving unit 1010 is connected to the first channel driver 1111. The photocurrent Ip generated from the light receiving unit 1010 may also be transmitted to the first channel CH1 through the first channel driver 1111. Although not illustrated in the drawing, photocurrents generated from light receiving units of other first pixels may be transmitted to the first channel CH1 through the first channel driver 1111.

Figure 6:
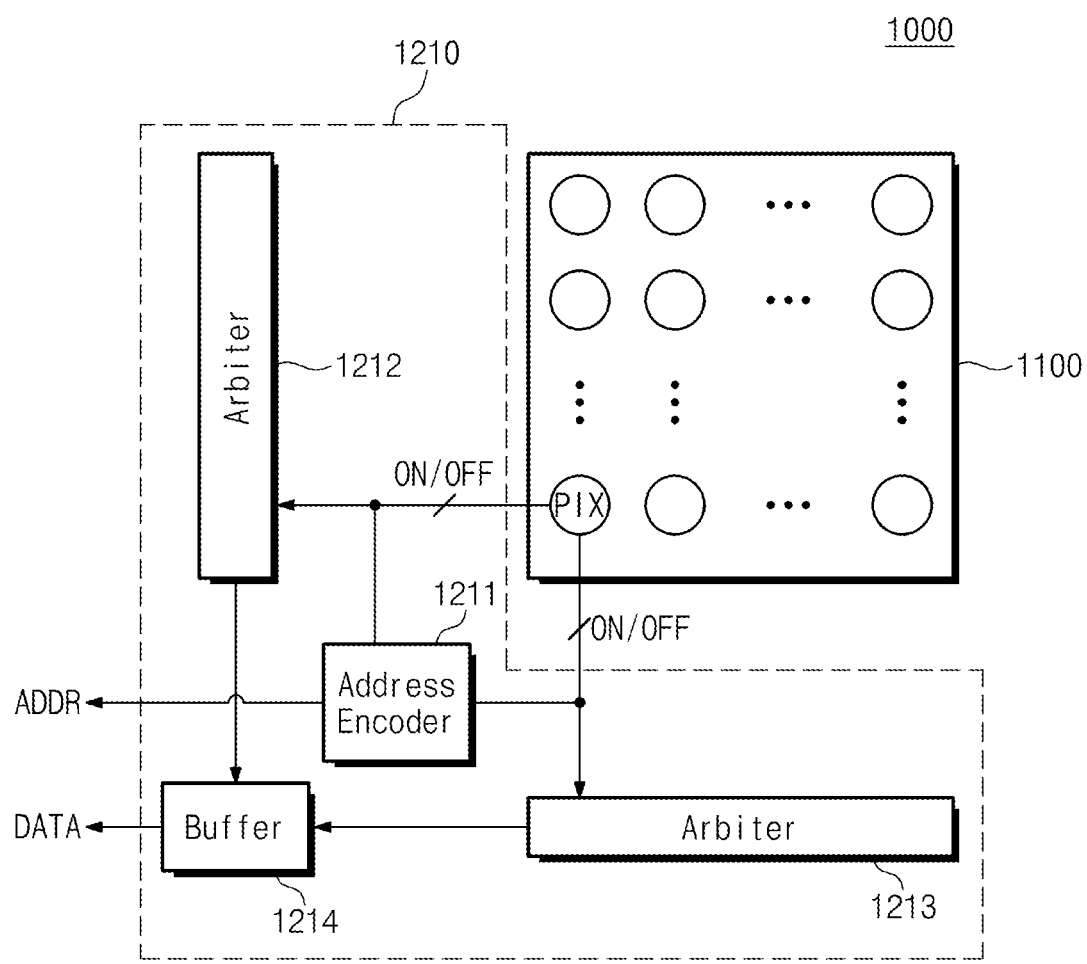
FIG. 6 is a block diagram illustrating a DVS driving unit and a first pixel illustrated in FIG. 1.

FIG. 6 is a block diagram illustrating a DVS driving unit and a first pixel illustrated in FIG. 1. For ease of description, the DVS driving unit 1210 is described based on the first pixel PIX_1. However, example embodiments of the inventive concept are not limited thereto.

Referring to FIGS. 5 and 6, the DVS driving unit 1210 may include an address encoder 1211, first and second arbiters 1212 and 1213 and a buffer 1214. The address encoder 1211 detects an address ADDR of the first pixel PIX_1 and outputs the detected address ADDR. The first and second arbiters 1212 and 1213 can detect the first and second signals (ON, OFF) being output from the first pixel PIX_1. The detected first and second signals (ON, OFF) are transmitted to the buffer 1214. The first and second arbiters 1212 and 1213 may output a reset signal RESET if the first and second arbiters 1212 and 1213 detect the first signal ON or the second signal OFF. The first pixel PIX_1 resets a control signal Vdiff in response to the reset signal RESET. The detected address ADDR and the first or second signals (ON or OFF) may be transmitted to an external device.

Figure 7:
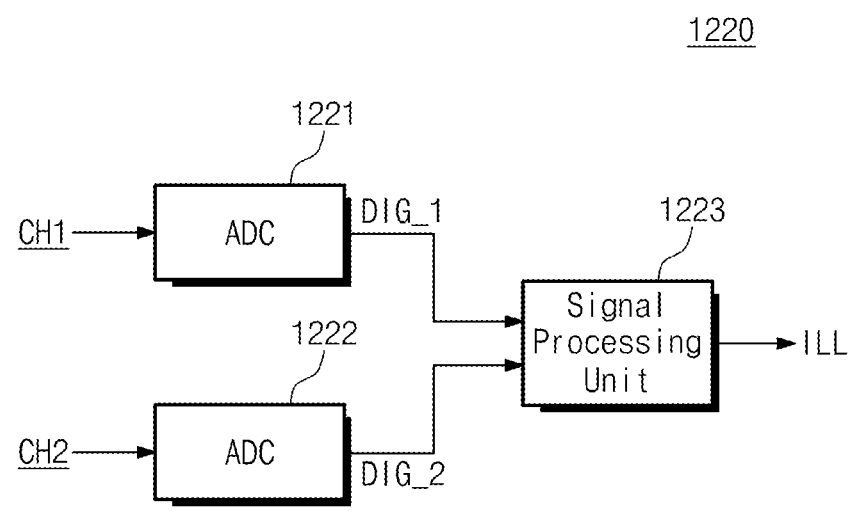
FIG. 7 is a block diagram illustrating an ALS driving unit illustrated in FIG. 1.

FIG. 7 is a block diagram illustrating an ALS driving unit illustrated in FIG. 1.

Referring to FIG. 7, the ALS driving unit 1220 includes first and second A/D converters 1211 and 1212, and a signal processing unit 1213. The first and second A/D converters 1211 and 1212 are configured to receive photocurrents of the first and second pixels PIX_1 and PIX_2 through the first and second channels CH1 and CH2 respectively. The first and second A/D converters 1211 and 1212 convert the received photocurrents into first and second digital signals DIG_1 and DIG_2. The photocurrent received through the first channel CH1 may be the sum of photocurrents generated in the first pixels PIX_1. The photocurrent being received through the second channel CH2 may be the sum of photocurrents generated in the second pixels PIX_2. The first and second digital signals DIG_1 and DIG_2 are transmitted to the signal processing unit 1213.

The signal processing unit 1213 processes the received first and second digital signals DIG_1 and DIG_2 to output illumination intensity data ILL. The first and second digital signals DIG_1 and DIG_2 may correspond to levels of the photocurrents received through the first and second channels CH1 and CH2 respectively. The first digital signal DIG_1 may indicate the intensity of light that entered the pixel array 1100. The second digital signal DIG_2 may indicate intensity of infrared light among light that entered the pixel array 1100. Illumination intensity indicates brightness of light that can be distinguished by the human eye. However, pixels included in the pixel array 1100 output photocurrents in response to not only visible light but also infrared light. That is, the first digital signal DIG_1 may indicate intensity of visible light and infrared light. The second digital signal DIG_2 may indicate intensity of infrared light. The signal processing unit 1223 may signal-process the first and second digital signals DIG_1 and DIG_2 to obtain a signal corresponding to visible light. The signal processing unit 1223 can output the signal-processed result as illumination intensity data ILL.

The photocurrents being transmitted through the first and second channels CH1 and CH2 may include a dark current. The dark current may be a parasitic reverse bias leakage current that flows through the pixel array 1100 when no photons are entering the device due to thermal fluctuations of charge carriers causing the generation of electrons and holes within a depletion region of the pixel array 1100.

The first and second digital signals DIG_1 and DIG_2 may include data corresponding to the dark current. Data corresponding to the dark current acts as noise of illumination intensity data ILL. The signal processing unit 1223 processes the first digital signal DIG_1 and the second digital signal DIG_2 to compensate for the noise due to the dark current.

Figure 8:
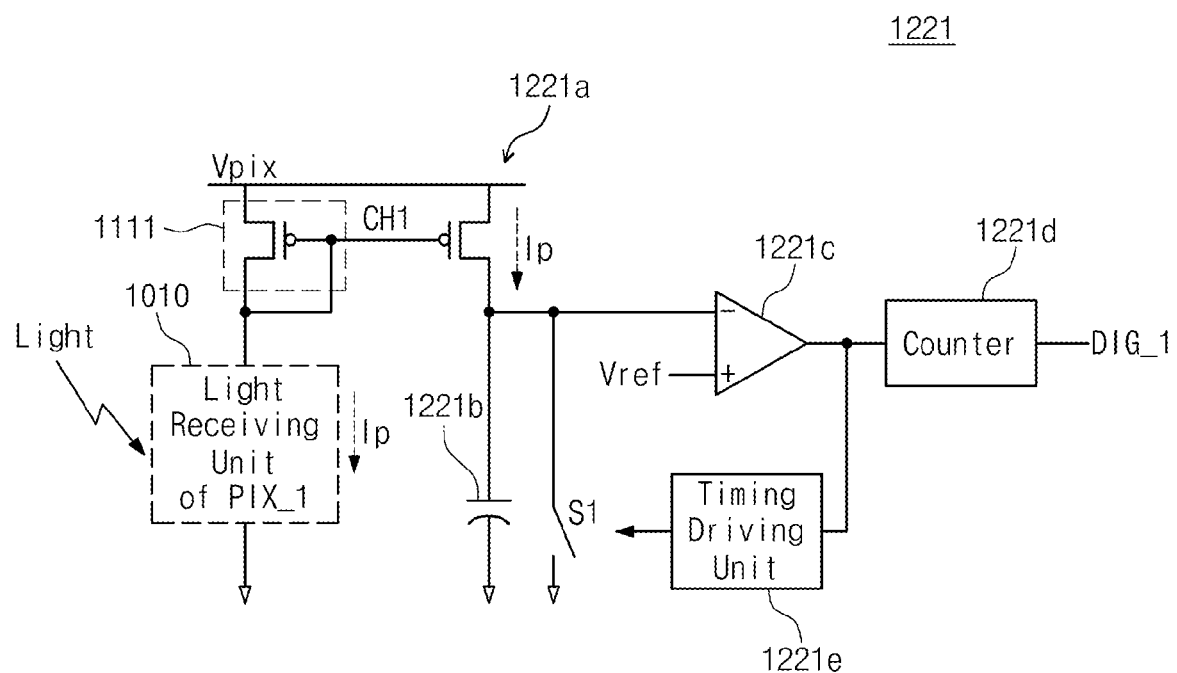
FIG. 8 is a circuit diagram illustrating a first A/D converter illustrated in FIG. 7.

FIG. 8 is a circuit diagram illustrating a first A/D converter illustrated in FIG. 7. The second A/D converter 1222 may include a circuit similar to the first A/D converter 1221 illustrated in FIG. 8. For brevity of drawing, one first pixel PIX_1 is illustrated in FIG. 8, however, example embodiments of the inventive concepts are not limited thereto. The first A/D converter 1221 can be connected to a plurality of first pixels PIX_1 included in the first area 1110.

Referring to FIG. 8, the first A/D converter 1221 includes a current mirror 1221a, a capacitor 1221b, a comparator 1221c, a counter 1221d, and a timing driving unit 1221e. The current mirror 1221a is connected to the first channel CH1. The current mirror 1221a can provide a current $I_P$ having the same level as a photocurrent received via the first channel CH1 to the capacitor 1221b. The capacitor 1221b is charged by the photocurrent $I_P$.

The timing driving unit 1221e can control a switch S1 in response to a reference clock. For example, the timing driving unit 1221e can turn the switch S1 on in response to the reference clock. In this case, a charging voltage charged in the capacitor C is discharged.

The charging voltage of the capacitor 1221b is supplied to the comparator 1221c. The comparator 1221c compares a reference voltage Vref with the charging voltage of the capacitor 1221b to transmit a comparison result to the counter 1221d. The counter 1221d can count the received comparison result to output the first digital signal DIG_1.

The first A/D converter 1221 can convert the amount of photocurrents flowing through the first channel CH1 during one cycle of the reference clock into a digital value to output the first digital signal DIG_1.

Figure 9:
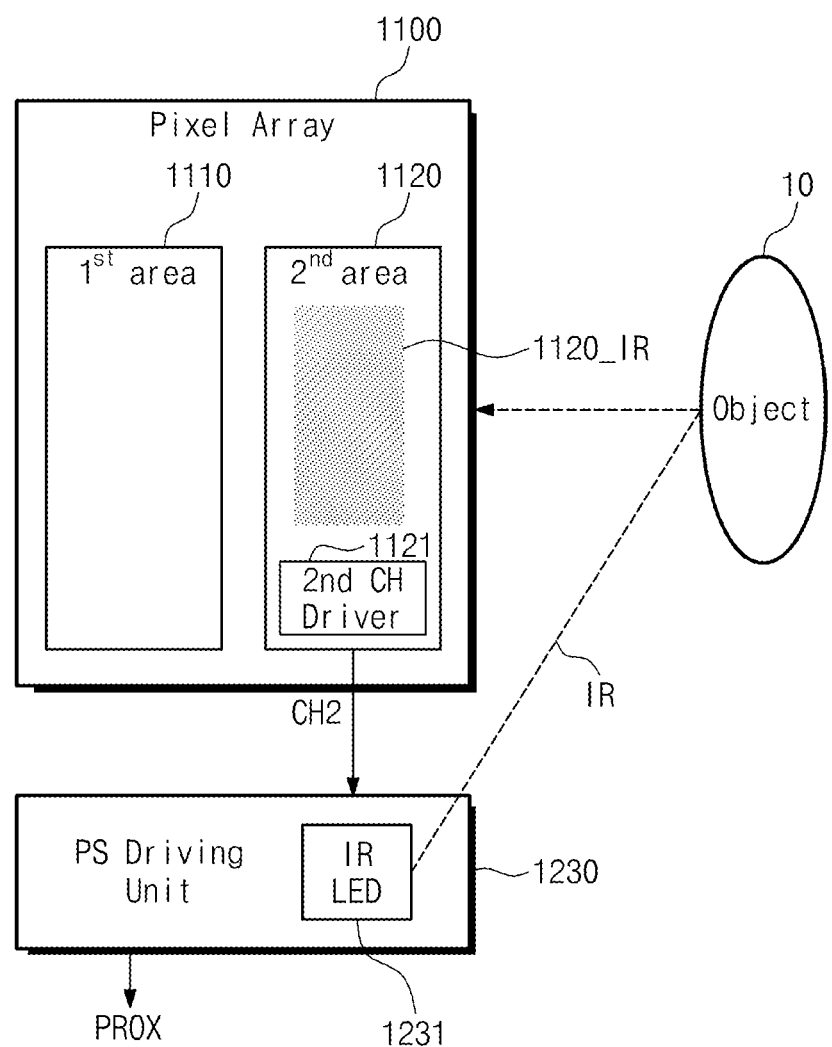
FIG. 9 is a drawing for explaining a PS driving unit illustrated in FIG. 1.

FIG. 9 is a drawing for explaining a PS driving unit illustrated in FIG. 1. Referring to FIG. 9, the PS driving unit 1230 includes an IR LED 1231. The IR LED 1231 is configured to emit an infrared light IR under the control of the PS driving unit 1230.

In the case that an object approaching the image device 1000 exists, infrared light emitted from the IR LED 1231 is reflected by the object to enter the pixel array 1100. In this case, since the second area 1120 includes the infrared pass filter 1120_IR, photocurrents being output from the second pixels PIX_2 included in the second area 1120 may increase. That is, photocurrents flowing through the second channel CH2 may increase. The PS driving unit 1230 detects the amount of change of photocurrents flowing through the second channel CH2 to judge whether the object is approaching the image device 1000 or not and output an approaching signal PROX.

The image device 1000 can perform operations of a dynamic vision sensor, an ambient light sensor and a proximity sensor together. Therefore, the image device 1000 may have a reduced cost and area.

Figure 10:
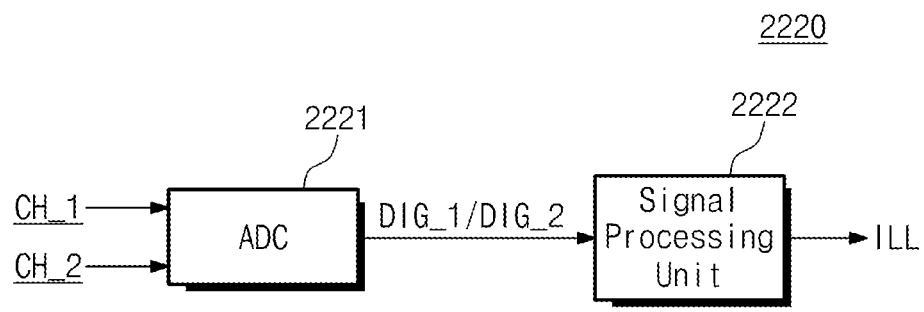
FIG. 10 is a block diagram illustrating an ALS driving unit in accordance with another example embodiment of the inventive concepts.
Figure 11:
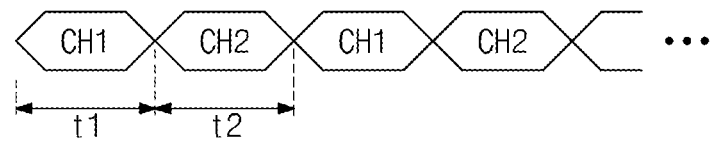
FIG. 11 is a timing diagram illustrating an operation of an ALS driving unit illustrated in FIG. 10.

FIG. 10 is a block diagram illustrating an ALS driving unit in accordance with another embodiment of the inventive concept. FIG. 11 is a timing diagram illustrating an operation of an ALS driving unit illustrated in FIG. 10.

Referring to FIG. 10, an ALS driving unit 2220 includes an A/D converter 2221 and a signal processing unit 2222. Unlike the ALS driving unit 1220 of FIG. 7, the ALS driving unit 2220 of FIG. 10 includes a single A/D converter 2221. The A/D converter 2221 receives and converts a photocurrent from first and second channels CH1 and CH2 to output first and second digital signals DIG_1 and DIG_2.

As illustrated in FIG. 11, the A/D converter 2221 can convert a photocurrent received from the first channel CH1 during first time (t1) to output the first digital signal DIG_1. The A/D converter 2221 can convert a photocurrent received from the second channel CH2 during second time (t2) to output the second digital signal DIG_2. The A/D converter 2221 can repeatedly perform the aforementioned operation to output the first and second digital signals DIG_1 and DIG_2.

The signal processing unit 2222 can process the received first and second digital signals DIG_1 and DIG_2 to output illumination intensity data ILL.

Figure 12:
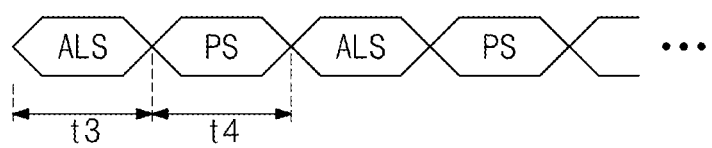
FIG. 12 is a timing diagram illustrating an operation of an image device in accordance with still another example embodiment of the inventive concepts.

FIG. 12 is a timing diagram illustrating an operation of an image device in accordance with still another example embodiment of the inventive concepts.

Referring to FIGS. 1 and 12, the image device 1000 can perform operations of a dynamic vision sensor, an ambient light sensor and a proximity sensor together. In this case, as illustrated in FIG. 12, the image device 1000 can operate as the ambient light sensor during third time (t3), and then can operate as the proximity sensor during fourth time (t4). That is, the ALS driving unit 1220 operates during the third time (t3) to output illumination intensity data ILL and the PS driving unit 1230 operates during the fourth time (t4) to output proximity data PROX.

Figure 13:
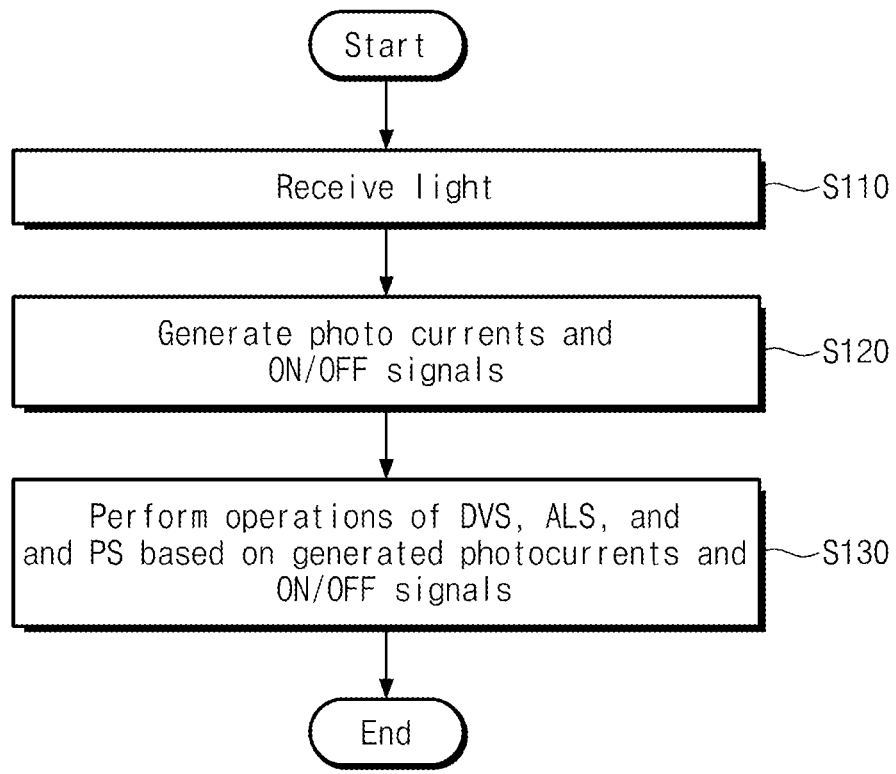
FIG. 13 is a flow chart illustrating an operation of an image device in accordance with an example embodiment of the inventive concepts.

FIG. 13 is a flow chart illustrating an operation of an image device in accordance with an example embodiment of the inventive concepts.

Referring to FIGS. 1 and 13, in an operation S110, the image device 1000 can receive light from the outside.

In an operation S120, the image device 1000 can generate photocurrents and ON/OFF signals on the basis of the received light. For example, the image device 1000 can generate photocurrents and ON/OFF signals on the basis of the operation of a pixel described with reference to FIG. 5.

In an operation S130, the image device 1000 can perform operations of a dynamic vision sensor (DVS), an ambient light sensor (ALS) and a proximity sensor (PS) on the basis of the generated photocurrents and ON/OFF signals. For example, the image device 1000 can perform an operation of the dynamic vision sensor (DVS) on the basis of the ways described with reference to FIG. 6 to output contrast data and an address ADDR. The image device 1000 can perform an operation of the ambient light sensor (ALS) on the basis of the ways described with reference to FIGS. 7 and 8 to output illumination intensity data ILL. The image device 1000 can perform an operation of proximity sensor (PS) on the basis of the ways described with reference to FIG. 9 to output proximity data PROX. The operations (DVS, ALS, PS) of the operation S130 may be performed together or at regular time intervals.

The image device 1000 can transmit the generated contrast data, address ADDR, illumination intensity data ILL and proximity data PROX to an external device (e.g., AP, a host). The external device can perform additional operations (for example, operations of a display brightness control, an object tracking and a display turn on/off) on the basis of the received data and signals.

According to one or more example embodiments of the inventive concepts, the image device can perform operations of DVS, ALS, and PS together or at regular time intervals. Thus, an image device having a reduced cost and area is provided.

Figure 14:
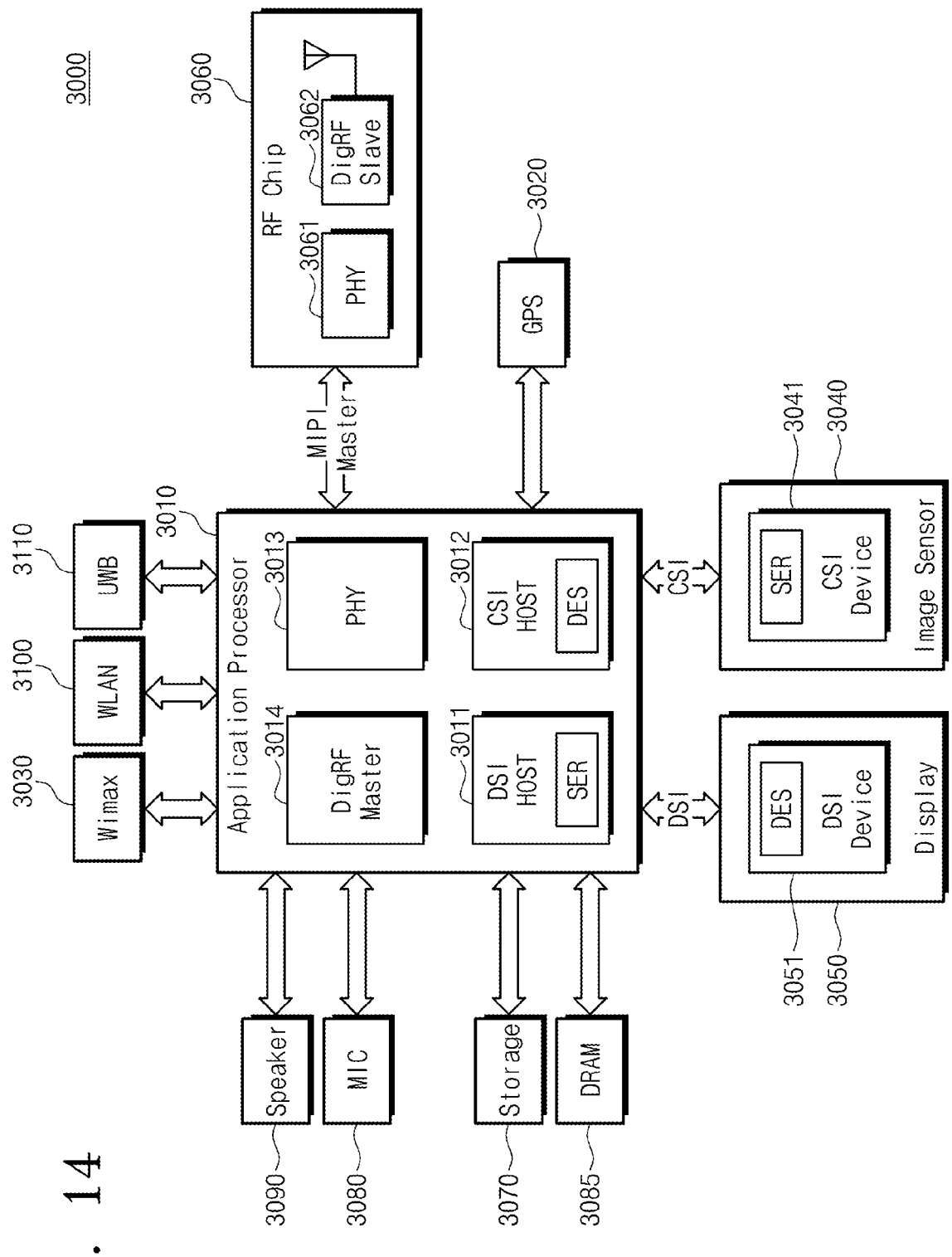
FIG. 14 is a block diagram illustrating an electronic system and an interface to which an image device in accordance with an example embodiment of the inventive concepts is applied.

FIG. 14 is a block diagram illustrating an electronic system and an interface to which an image device in accordance with example embodiments of the inventive concepts is applied.

Referring to FIG. 14, an electronic system 3000 can be embodied by a data processing device such as a mobile phone, a PDA, a PMP, or a smart phone that can use or support a MIPI interface. The electronic system 3000 may be provided as one of an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder and a digital video player.

The electronic system 3000 includes an application processor 3010, an image sensor 3040 and a display 3050. The image sensor 3040 may include the image device described with reference to FIGS. 1 through 12. The image sensor 3040 can perform operations of a dynamic vision sensor (DVS), an ambient light sensor (ALS) and a proximity sensor (PS) separately or together. The image sensor 3040 can be embodied in one chip.

A CSI host 3012 embodied in the application processor 3010 can serially communicate with a CSI device 3041 of the image sensor 3040 through a camera serial interface (CSI). An optical deserializer may be embodied in the CSI host 3012 and an optical serializer may be embodied in the CSI device 3041.

A DSI host 3011 embodied in the application processor 3010 can serially communicate with a DSI device 3051 of the display 3050 through a display serial interface (DSI). An optical deserializer may be embodied in the DSI host 3011 and an optical serializer may be embodied in the DSI device 3041.

The electronic system 3000 may further include an RF chip 3060 that can communicate with the application processor 3010. A PHY 3013 of the application processor 3010 can exchange data with a PHY 3061 of the RF chip 3060 according to MIPI DigRF.

The electronic system 3000 may further include a GPS 3020, storage 3070, a Mic 3080, a DRAM 3085, and a speaker 3090. The electronic system 3000 can communicate using Wimax 3030, a WIAN 3100 and a UWB 3110.

According to example embodiments of the inventive concepts, the image device can perform operations of a dynamic vision sensor, an ambient light sensor and a proximity sensor together. Thus, the image device may have a reduced cost and area.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:
1. An image device comprising:
a pixel array including,
first pixels configured to generate first photocurrents based on an intensity of light received from outside and output first output signals based on the generated first photocurrents,
second pixels configured to generate second photocurrents based on an intensity of infrared light among the light received from the outside and output second output signals based on the generated second photocurrents, a first channel driver connected to the first pixels, the first channel driver configured to provide a sum of the first photocurrents generated in the first pixels to a first channel, and a second channel driver connected to the second pixels, the second channel driver configured to provide a sum of the second photocurrents generated in the second pixels to a second channel; and a controller configured to perform operations of a dynamic vision sensor, an ambient light sensor and a proximity sensor based on signals received from the pixel array, the controller including, a dynamic vision sensor driving unit configured to output contrast data and addresses based on the first and second output signal, the contrast data and the addresses corresponding to the first and second pixels respectively, an ambient light sensor driving unit configured to output illumination intensity data based on the sum of the first photocurrents received through the first channel and the sum of the second photocurrents received through the second channel, and a proximity sensor driving unit configured to output a proximity signal based on an amount of change in the sum of the second photocurrents received through the second channel.

2. The image device of claim 1, wherein each of the first and second channel drivers is a transistor.

3. The image device of claim 1, wherein each of the first pixels comprises:
a first light receiving unit configured to generate the first photocurrent in response to the received light;
a first comparing unit configured to generate a first control signal based on the generated first photocurrent; and
a first quantizing unit configured to output the first output signal according to the first control signal, and wherein each of the second pixels includes:
an infrared pass filter configured to pass the infrared light among the received light as filtered light;
a second light receiving unit configured to generate the second photocurrent in response to the filtered light;
a second comparing unit configured to generate a second control signal based on the generated second photocurrent; and
a second quantizing unit configured to output the second output signal according to the second control signal, and wherein
the first and second comparing units are configured to reset the control signals according to a reset signal received from the dynamic vision sensor driving unit.

4. The image device of claim 3, wherein the first comparing unit is configured to increase a level of the first control signal, if the first photocurrent increases and reduce a level of the first control signal, if the first photocurrent is reduced, and the second comparing unit is configured to increase a level of the second control signal, if the second photocurrent increases and reduce a level of the second control signal, the second photocurrent is reduced.

5. The image device of claim 4, wherein each of the first and second output signals include an ON signal and an OFF signal, and
the first pixels are configured to output the first output signal such that,
the first output signal is the ON signal, if the first control signal reaches a first critical value, and the first output signal is the OFF signal, if the first control signal reaches a second critical value; and
the second pixels are configured to output the second output signal such that,
second output signal is the ON signal, if the second control signal reaches a third critical value, and
the second output signal is the OFF signal, if the second control signal reaches a fourth critical value.

6. The image device of claim 5, wherein the fourth critical value is greater than the second critical value, the third critical value is greater than the fourth critical value and the first critical value is greater than the third critical value.

7. The image device of claim 5, wherein the dynamic vision sensor driving unit is configured to transmit the reset signal to a pixel outputting the ON or OFF signal.

8. The image device of claim 3, wherein the first light receiving unit is connected to the first channel driver and the second light receiving unit is connected to the second channel driver.

9. The image device of claim 1, wherein the dynamic vision sensor driving unit comprises:
first and second arbiters configured to detect the first output signals of the first pixels;
an address encoder configured to detect an address of the first pixels; and
a buffer configured to temporarily store the detected first output signals, wherein
the dynamic vision sensor driving unit is configured to output the detected first output signals and the detected address to an external device.

10. The image device of claim 1, wherein the ambient light sensor driving unit comprises:
a first analog-digital converter configured to convert the sum of the first photocurrents received through the first channel into a first digital signal;
a second analog-digital converter configured to convert the sum of the second photocurrents received through the second channel into a second digital signal; and
a signal processing unit configured to process the first digital signal and second digital signal to output the illumination intensity data.

11. The image device of claim 10, wherein the first analog-digital converter comprises:
a current mirror configured to generate a first current equal to the sum of the first photocurrents received thereby;
a capacitor configured charge based on the first current to generate a charging voltage;
a switch parallel-connected with the capacitor;
a comparator configured to compare the charging voltage with a reference voltage and output a comparison result;
a counter configured to count an output of the comparator and generate the first digital signal based on a result of the counting; and
a timing controller configured to control the switch so that the charging voltage is discharged based on the comparison result.

12. The image device of claim 10, wherein the second analog-digital converter comprises:
a current mirror configured to generate a second current equal to the sum of the second photocurrents received thereby;
a capacitor configured to charge based on the second current to generate a charging voltage;
a switch parallel-connected with the capacitor;
a comparator configured to compare the charging voltage with a reference voltage and output a comparison result;

a counter configured to count an output of the comparator and generate the second digital signal based on a result of the counting; and a timing controller configured to control the switch so that the charging voltage is discharged based on the comparison result.

13. The image device of claim 1, wherein the ambient light sensor comprises:

an analog-digital converter configured to convert the sum of the first photocurrent and the sum of the second photocurrent into first and second digital signals respectively; and a signal processing unit configured to process the first digital signal and the second digital signal to output the illumination intensity data.

14. The image device of claim 1, wherein the proximity sensor driving unit comprises:

an infrared light emitting diode, and wherein the proximity sensor is configured to generate the proximity signal based on the amount of the change of the sum of the second photocurrents.

15. The image device of claim 14, wherein proximity sensor is configured to increase a level of the proximity signal if the sum of the second photocurrents increases.

16. An image device comprising:

a pixel array including first pixels and second pixels therein, the first pixels configured to generate a first photocurrent and a first activity signal based on an intensity of at least visible light received incident thereto and the second pixels configured to generate a second photocurrent and a second activity signal based on an intensity of infrared light received incident thereto; and a controller including, a dynamic vision sensor driving unit configured to generate motion data indicating a motion of an external object based on the first photocurrent from the first pixels whose first activity signal is enabled;

an ambient light sensor driving unit configured to generate illumination data indicating an intensity of the visible light; and a proximity sensor driving unit configured to generate proximity data based on a change in the second photocurrent, the proximity data indicating a proximity of an object to the image device.

17. The image device of claim 16, wherein each of the first pixels include a transistor configured output a sum of the first photocurrents and each of the second pixels include a second transistor configured to output a sum of the second photocurrents, and the ambient light sensor driving unit is configured to generate the illumination data based on the sum of the first photocurrents and the sum of the second photocurrents.

18. The image device of claim 16, wherein each of the first pixels includes, a photo detector configured to generate the first photocurrent based on the intensity of at least the visible light received incident thereto;

a comparator configured to generate a comparing signal based on a variation in the first photocurrent; and a quantizer configured to generate the first activity signal if the variation in the first photocurrent exceeds a threshold.

19. The image device of claim 17, wherein the dynamic vision sensor driving unit is configured to determine locations of the first pixels and second pixels within the pixel array that are enabled based on the first activity signal and the second activity signal, respectively.

20. The image device of claim 16, wherein each of the first pixels and second pixels are configured to asynchronously output the first photocurrent and the second photocurrent, respectively, and the dynamic vision sensor driving unit is configured to determine the motion of the external object without utilizing data from the first pixels of the image device that do not detect a change in the intensity of the visible light.

* * * * *